(12) United States Patent
Huang

(10) Patent No.: US 6,992,325 B2
(45) Date of Patent: Jan. 31, 2006

(54) ACTIVE MATRIX ORGANIC ELECTROLUMINESCENCE DISPLAY DEVICE

(75) Inventor: Wei-Pang Huang, Hsinchu (TW)

(73) Assignee: Au Optronics Corp., Hsinchu (TW)

( * ) Notice: Subject to any disclaimer, the term of this patent is extended or adjusted under 35 U.S.C. 154(b) by 92 days.

(21) Appl. No.: 10/691,640

(22) Filed: Oct. 24, 2003

(65) Prior Publication Data

US 2005/0012091 A1  Jan. 20, 2005

(30) Foreign Application Priority Data

Jul. 18, 2003  (TW) ............................... 92119704 A

(51) Int. Cl.
H01L 35/24 (2006.01)
(52) U.S. Cl. ........................... 257/40; 257/22; 257/98; 257/103; 257/395; 257/626; 257/635
(58) Field of Classification Search ............. 357/13, 357/40, 79–103, 394, 395, 626, 918, 629–652, 357/758, 760
See application file for complete search history.

(56) References Cited

U.S. PATENT DOCUMENTS

| 5,943,599 | A | 8/1999 | Yao et al. ................... 438/623 |
| 6,773,969 | B2 * | 8/2004 | Lee et al. ................... 438/149 |
| 2003/0143319 | A1 * | 7/2003 | Park et al. ..................... 427/64 |
| 2004/0209487 | A1 * | 10/2004 | Choi et al. ................... 438/788 |

* cited by examiner

*Primary Examiner*—Andy Huynh
(74) *Attorney, Agent, or Firm*—Troxell Law Office, PLLC

(57) ABSTRACT

An active matrix organic electroluminescence display device capable of maintaining the brightness of the organic light emitting diode. The active matrix organic electroluminescence display device comprises a thin film transistor and an organic light emitting diode. By improving the structure of the passivation layer of the thin film transistor to reduce the leakage current occurring in the TFT, the brightness of the organic light emitting diode can be stably maintained.

4 Claims, 3 Drawing Sheets

ACTIVE MATRIX ORGANIC ELECTROLUMINESCENCE DISPLAY DEVICE

FIELD OF THE INVENTION

The present invention relates to an organic electroluminescence display device and, more specifically, to a structure of an active matrix organic electroluminescence display device for reducing the leakage current occurring in the thin-film transistor so as to maintain the brightness of the organic light emitting diode.

BACKGROUND OF THE INVENTION

Owing to high brightness, fast response speed, light weight, thin and small features, full color, no viewing angle differences, no need for an LCD back-light board and low electrical consumption, an organic light emitting diode display or organic electroluminescence display (OLED) takes the lead to substitute a twist nematic (TN) or a super twist nematic (STN) liquid crystal display. Further, it substitutes for a small-sized thin-film transistor (TFT) LCD to become a new display material of fabricating portable information products, cell phones, personal digital assistant (PDA) and notebook.

The organic light emitting diode display comprises passive matrix organic light emitting diode displays (PMOLED) and active matrix organic light emitting diode displays (AMOLED). Thin film transistors in combination with signals of a storage capacitor are used in the AMOLED to control the gray scale presentation of the organic light emitting diode. After the scan line sweeps, the original brightness of the pixels is still maintained. However, for the PMOLEDs, only the pixels selected by the scan line will be lighted. Hence, it is not necessary to drive the organic light emitting diodes in the AMOLED to the very high brightness, and the AMOLED has a long lifetime and a high resolution.

Please refer to FIG. 1, which is a schematic side view of a structure of the AMOLED. The thin film transistor 1 of the AMOLED includes a gate metal 11, a dielectric insulation layer 12, a source/drain metal 13, an amorphous silicon layer 14, a doped amorphous silicon 15 and a passivation layer 16. The organic light emitting diode 2 of the AMOLED includes an indium tin oxide (ITO) electrode 21, an organic emitting layer 22 and a cathode electrode 23. The ITO electrode 21 is connected to the source/drain metal 13. Since the AMOLED is a current-driven element, a given current has to be provided to maintain the consistent brightness of the organic light emitting diodes.

As shown in FIG. 1, the current passes the source/drain metal 13 of the TFT 1 through the ITO electrode 21 and flows into the organic emitting layer 22 and the cathode electrode 23, as shown in the direction of the arrows, and then the organic light emitting diode radiate light. However, in the current technology, the brightness of the organic light emitting diode decays when the given current is provided. Therefore, it is desired to find out the causes of the unstable brightness of the AMOLED and to improve the structure of the AMOLED so as to fabricate an AMOLED capable of maintaining the brightness of the organic light emitting diode.

SUMMARY OF THE INVENTION

An object of the present invention is to provide an active matrix organic electroluminescence display device capable of maintaining the brightness of the organic light emitting diode. By improving the structure of the passivation layer of the thin film transistor to reduce the leakage current occurring in the TFT, the brightness of the organic light emitting diode can be stably maintained.

A structure of an active matrix organic electroluminescence display device with the stable emitting brightness is disclosed in this invention. The active matrix organic electroluminescence display device comprises a thin film transistor and an organic light emitting diode, wherein the passivation layer of the thin film transistor is a multi-layer structure. The thickness of the multi-layer structure is more than that of a conventional passivation layer, and each layer of the multi-layer structure can be made of a different dielectric material.

In another embodiment of this invention, the surface of the passivation layer of the thin film transistor of the AMOLED is thermally oxidized.

In still another embodiment of this invention, the passivation layer of the thin film transistor of the AMOLED is made of a high dielectric material.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

Figure 1:
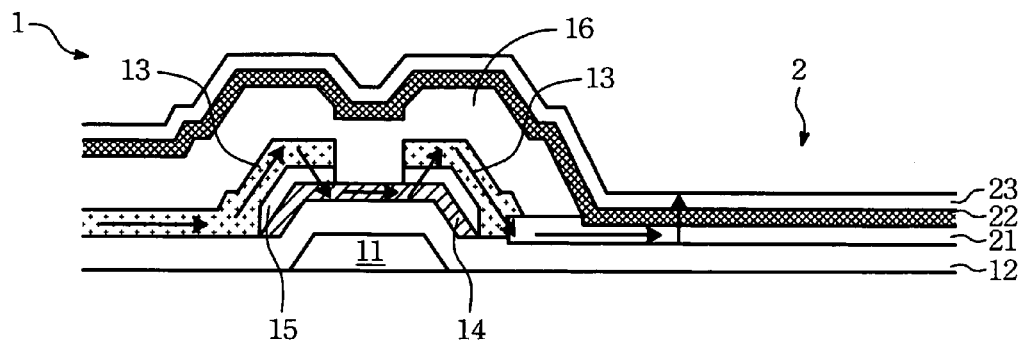
FIG. 1 s a schematic side view of a structure of the conventional active matrix organic light emitting diode display (AMOLED)
Figure 2:
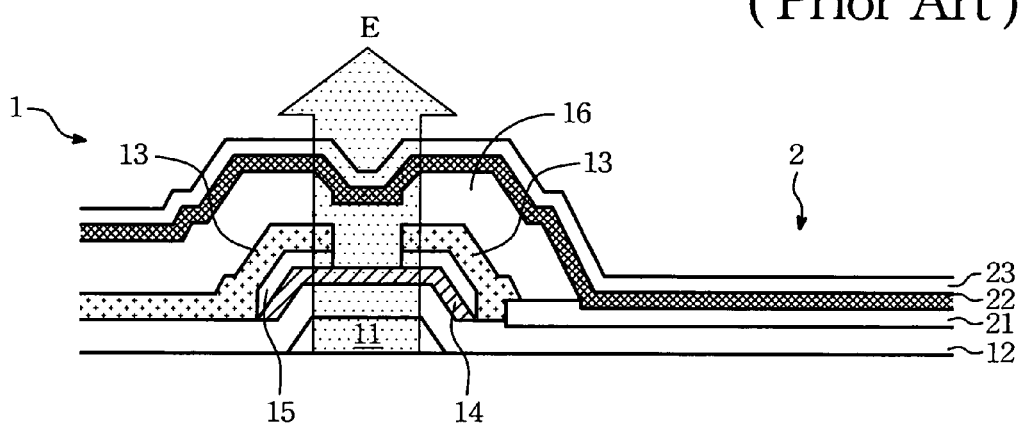
FIG. 2 shows a strong electric field between the gate metal and the cathode electrode of the AMOLED in FIG. 1.

A structure of an active matrix organic electroluminescence display device capable of maintaining the stable emitting brightness is provided in this invention. According to researches, the cause of the unstable brightness of the AMOLED is found. When the TFT 1 of the AMOLED operates, a voltage is applied on the gate metal 11 and there is a strong electric field E between the gate metal 11 and the cathode electrode 23, as shown in FIG. 2. The passivation layer 16 of the TFT 1 is made of a dielectric material such as $SiN_x$.

Figure 3:
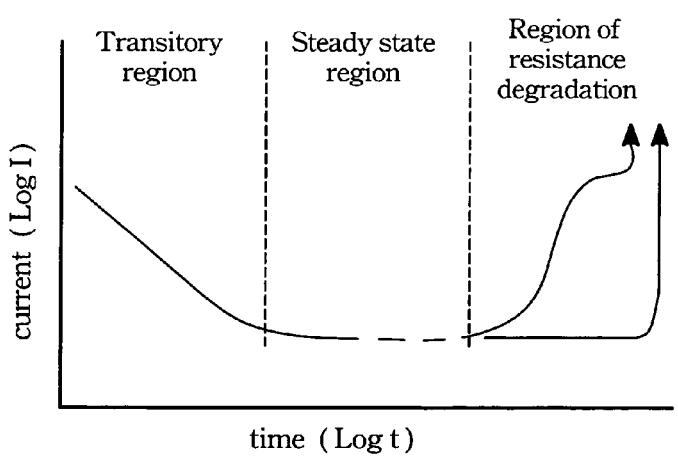
FIG. 3 a diagram showing the variation of a current flowing a dielectric material in a given voltage with respect to time.
Figure 4:
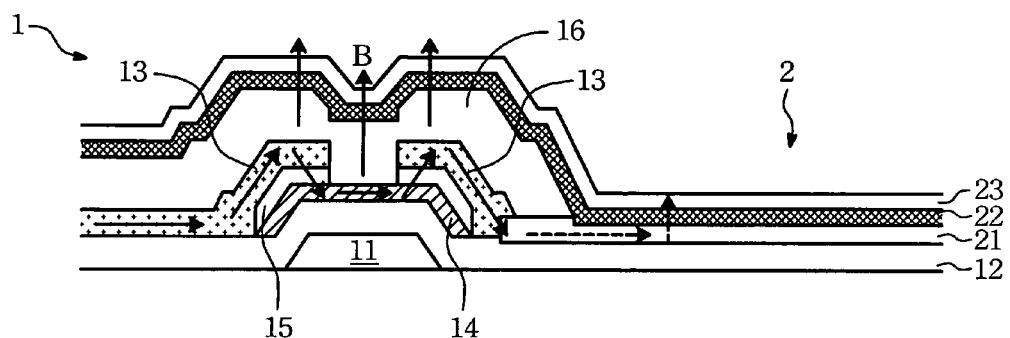
FIG. 4 shows a large amount of leakage current flowing out from the passivation layer of the AMOLED in FIG. 1.

FIG. 3 shows the variation of a current flowing such dielectric material in a given voltage with respect to time. When the current-resistant ability of the passivation layer 16 is poor, a breakdown will occur in the passivation layer 16 after a certain of period and a large amount of leakage current flows out from the passivation layer 16, as shown by the arrow B in FIG. 4. Even though a given current is provided, the current flowing through the ITO electrode into the organic emitting layer 22 is greatly reduced to result in the brightness decay of the organic light emitting diode. Therefore, in order to reduce the occurrence of the leakage current, to have the given current provided effectively pass the organic light emitting diode rather than flow out from the other pathways, and thus to maintain the brightness of the organic light emitting diode and to increase the lifetime of the AMOLED element, the structure of the passivation layer of the TFT is improved in this invention.

Figure 5:
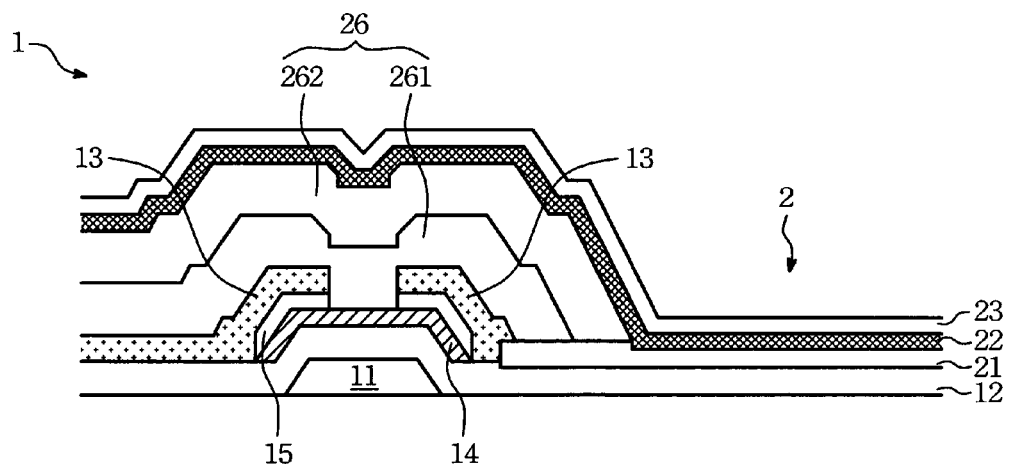
FIG. 5 is a schematic side view of a structure of the passivation layer of the TFT of the AMOLED in accordance with a first embodiment of this invention.

Refer to FIG. 5, which is a schematic side view of a structure of the passivation layer of the TFT of the AMOLED in accordance with a first embodiment of this invention. A passivation layer 26 of a multi-layer structure is fabricated to enhance the current-leakage resistant ability of the passivation layer 26. For instance, at least two-layer SiNx is plated, each layer of which is in a 3000 Å thickness. Alternatively, one layer of the at least two-layer structure is made of SiNx and another layer is made of the other dielectric material. As shown in FIG. 5, the passivation layer 26 is composed by a two-layer structure 261, 262. The current-leakage resistant ability of the passivation layer 26 can be doubly enhanced by increasing the thickness of the dielectric layer of the passivation layer and increasing the interface between the dielectric layers because of multi-layer plating.

Figure 6:
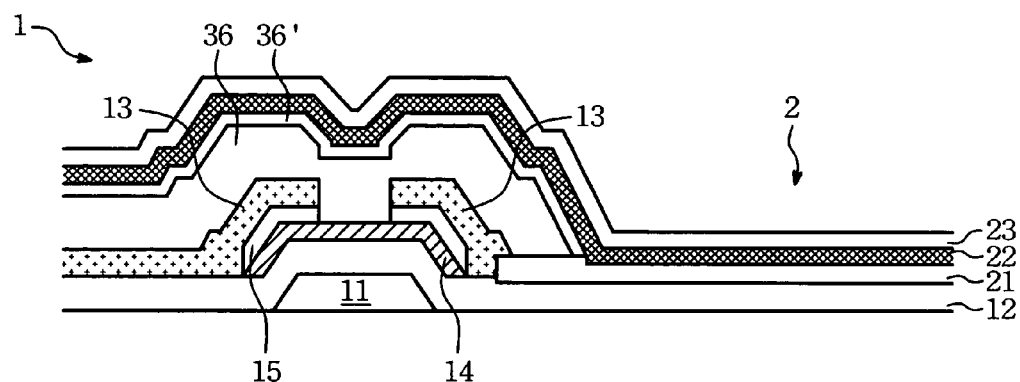
FIG. 6 is a schematic side view of a structure of the passivation layer of the TFT of the AMOLED in accordance with a second embodiment of this invention.

Furthermore, the surface of the passivation layer can also be treated by thermal oxidation in this invention to enhance the current-leakage resistant ability of the passivation layer. FIG. 6 is a schematic side view of a structure of the passivation layer of the TFT of the AMOLED in accordance with a second embodiment of this invention. For instance, after a SiNx passivation layer 36 is plated, the SiNx layer is in a thermal oxidation treatment and SiON is formed on the surface 36' of the passivation layer 36 to enhance the current-leakage resistant ability of the passivation layer.

Figure 7:
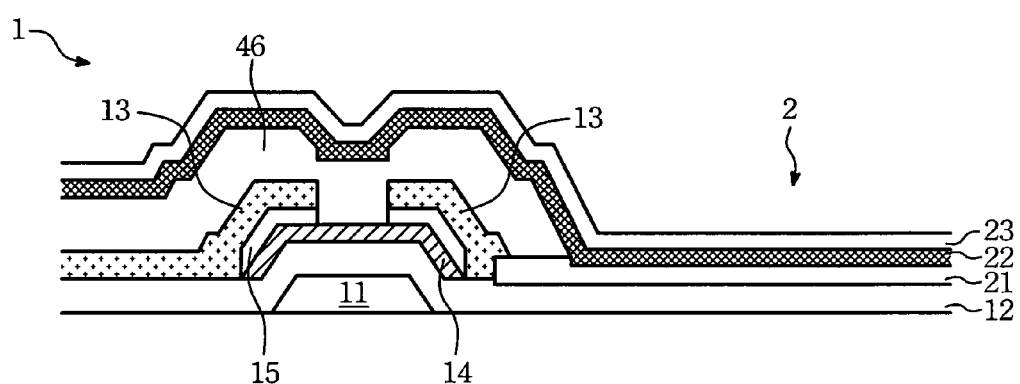
FIG. 7 is a schematic side view of a structure of the passivation layer of the TFT of the AMOLED in accordance with a third embodiment of this invention.

In addition, FIG. 7 is a schematic side view of a structure of the passivation layer of the TFT of the AMOLED in accordance with a third embodiment of this invention. A high dielectric material such as $SiO_2$ can be used to fabricate a passivation layer 46 to enhance the current-leakage resistant ability of the passivation layer.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. An active matrix organic electroluminescence display device, comprising:
    a thin film transistor, comprising:
        a gate metal disposed on a substrate;
        a dielectric insulation layer covering said gate metal and said substrate;
        a source/drain metal disposed on said dielectric insulation layer and above said gate metal; and
    a passivation layer covering said source/drain metal and being a multi-layer structure, wherein said multi-layer structure includes one silicon nitride layer with the thickness of approximately 3000 Å; and
    an organic light emitting diode, comprising:
        an anode electrode connected to said source/drain metal;
        an organic emitting layer formed on said anode electrode; and
        a cathode electrode formed on said organic emitting layer.

2. The active matrix organic electroluminescence display device of claim 1, wherein said multi-layer structure includes at least two SiNx layers, each layer of which approximately has a thickness of 3000 Å.

3. An active matrix organic electroluminescence display device, comprising:
    a thin film transistor, comprising:
        a gate metal disposed on a substrate;
        a dielectric insulation layer covering said gate metal and said substrate;
        a source/drain metal disposed on said dielectric insulation layer and above said gate metal; and
    a passivation layer covering said source/drain metal, wherein a surface of said passivation layer is thermally oxidized; and
    an organic light emitting diode, comprising:
        an anode electrode connected to said source/drain metal;
        an organic emitting layer formed on said anode electrode; and
        a cathode electrode formed on said organic emitting layer.

4. The active matrix organic electroluminescence display device of claim 3, wherein said passivation layer is made of SiNx and the surface thereof is thermally oxidized to form SiON.

* * * * *